United States Patent
Kim

(10) Patent No.: US 9,544,484 B2
(45) Date of Patent: Jan. 10, 2017

(54) LIGHT EMITTING DEVICE AND ELECTRONIC APPARATUS INCLUDING THE SAME

(71) Applicant: Seoul Semiconductor Co., Ltd., Ansan-si (KR)

(72) Inventor: Bang Hyun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/443,952

(22) PCT Filed: Nov. 18, 2013

(86) PCT No.: PCT/KR2013/010446
§ 371 (c)(1),
(2) Date: May 19, 2015

(87) PCT Pub. No.: WO2014/077643
PCT Pub. Date: May 22, 2014

(65) Prior Publication Data
US 2015/0326767 A1    Nov. 12, 2015

(30) Foreign Application Priority Data

Nov. 19, 2012 (KR) ........................ 10-2012-0130751

(51) Int. Cl.
*G03B 15/05* (2006.01)
*H01L 33/54* (2010.01)
(Continued)

(52) U.S. Cl.
CPC ............. *H04N 5/2256* (2013.01); *F21V 5/048* (2013.01); *F21V 9/16* (2013.01); *F21V 23/005* (2013.01);
(Continued)

(58) Field of Classification Search
CPC .......... H04N 5/2245; F21V 5/048; F21V 9/16; F21V 23/005; F21V 33/0052
See application file for complete search history.

(56) References Cited

U.S. PATENT DOCUMENTS

2005/0173721 A1* 8/2005 Isoda ...................... H01L 33/54
                                                      257/99
2006/0105484 A1* 5/2006 Basin ..................... B29C 39/006
                                                      438/27
(Continued)

FOREIGN PATENT DOCUMENTS

JP      2005-223112     8/2005
JP      2010-40801      2/2010
(Continued)

OTHER PUBLICATIONS

International Search Report issued on Feb. 21, 2014 in International Application No. PCT/KR2013/010446.
(Continued)

*Primary Examiner* — Twyler Haskins
*Assistant Examiner* — Fayez Bhuiyan
(74) *Attorney, Agent, or Firm* — H.C. Park & Associates, PLC

(57) ABSTRACT

A light-emitting device includes a board, a light-emitting diode chip disposed on the board, a molding part disposed on the board and covering the light-emitting diode chip, and a lens cap disposed on the board that is coupled with the substrate thereon and covering the molding part. An air gap is disposed between the lens cap and the molding part.

18 Claims, 6 Drawing Sheets

(51) Int. Cl.
*H04N 5/225* (2006.01)
*F21V 5/04* (2006.01)
*F21V 9/16* (2006.01)
*F21V 23/00* (2015.01)
*F21V 33/00* (2006.01)
*H01L 33/58* (2010.01)
*F21W 131/40* (2006.01)
*H01L 33/48* (2010.01)

(52) U.S. Cl.
CPC ........... F21V 33/0052 (2013.01); G03B 15/05 (2013.01); H01L 33/58 (2013.01); *F21W 2131/40* (2013.01); *H01L 33/486* (2013.01); *H01L 33/54* (2013.01); *H01L 2924/0002* (2013.01)

(56) References Cited

U.S. PATENT DOCUMENTS

| | | |
|---|---|---|
| 2010/0308354 A1 | 12/2010 | David et al. |
| 2011/0006323 A1 | 1/2011 | Suzuki et al. |

FOREIGN PATENT DOCUMENTS

| | | |
|---|---|---|
| JP | 2012-169507 | 9/2012 |
| KR | 10-2010-0123763 | 11/2010 |
| KR | 10-2012-0032699 | 4/2012 |
| KR | 10-2011-0139385 | 3/2013 |

OTHER PUBLICATIONS

Written Opinion issued on Feb. 21, 2014 in International Application No. PCT/KR2013/010446.

* cited by examiner

LIGHT EMITTING DEVICE AND ELECTRONIC APPARATUS INCLUDING THE SAME

CROSS-REFERENCE TO RELATED APPLICATIONS

This application is the National Stage Entry of International Application No. PCT/KR2013/010446, filed on Nov. 18, 2013, and claims priority from and the benefit of Korean Patent Application No. 10-2012-0130751, filed on Nov. 19, 2012, both of which are incorporated herein by reference for all purposes as if fully set forth herein.

BACKGROUND

Field

The present invention relates to a light emitting device and an electronic apparatus including the same, and more particularly, to a lens cap integrated light emitting device and an electronic apparatus including the same Discussion of the Background Generally, a light emitting diode (LED), which is a semiconductor element for generating light by applying a current, emits light by recombining electrons and holes injected using a p-n junction structure of a semiconductor with each other. The light emitting diode has many advantages such as a rapid response speed, low power consumption, a long lifespan, excellent initial driving characteristics, and the like, and has been widely used in various fields and for various purposes due to these advantages.

Recently, a lens integrated light emitting device including a lens therein has been used for the purpose of a camera flash of a portable terminal such as a mobile phone. The lens serves to collect or disperse light emitted from a light emitting diode chip, and adjusts distribution of light of the light emitting diode in a photographing view angle of a camera when it is applied in a light emitting device for a flash.

A lens integrated light emitting device according to the related art has a structure in which a secondary optical lens adheres onto a reflector part by an adhesive or has a structure in which a cap including a secondary optical lens directly adheres onto a board. In the case of the former, a light emitting diode chip on which a phosphor is conformally coated is put below the lens in a reflector, and in the case of the latter, a light emitting diode chip on which a phosphor is conformally coated is accommodated in a cap in a state in which it is mounted on a flat panel board such as a printed circuit board (PCB).

The lens integrated light emitting device according to the related art as described above has a structure in which a space below the lens, that is, an air gap is enclosed by the lens and the reflector, or the cap. However, in this structure, when vapor is captured in the air gap, the vapor cannot be discharged to the outside, such that operation reliability may be significantly decreased. In addition, it is difficult to use a dome shaped lens in the light emitting device according to the related art as described above, such that versatility is low, and the air gap is present just above the light emitting diode chip on which the phosphor is conformally coated, such that efficiency in extracting the light from the light emitting diode chip is low. In spite of several problems as described above, a light emitting device including a lens, particularly, a flat panel type lens above the light emitting diode chip have been significantly demanded in a specific application such as a flash of a mobile terminal, or the like.

SUMMARY OF INVENTION

The present invention provides a light emitting device which may improve light extracting efficiency by further including a molding part encapsulating a light emitting diode chip in a lens cap and may smoothly discharge vapor to the outside even though the vapor is captured in the lens cap by configuring an air gap between the molding part and the lens cap so as to be in communication with the outside, and an electronic apparatus including the same.

According to an exemplary embodiment of the present invention, there is provided a light emitting device including: a board; a light emitting diode chip mounted on the board; a molding part formed on the board so as to cover the light emitting diode chip; and a lens cap coupled onto the board to cover the molding part, wherein an air gap is formed between the lens cap and the molding part. The molding part may be formed in a dome shape. The lens cap may include a wall part bonded to the board while enclosing the surrounding of the light emitting diode chip and a lens part positioned above the light emitting diode chip. The wall part may include one or more air circulation holes.

An upper surface of the lens part may be flat. The lens part may include a refracting part and a reflecting part formed on a lower surface thereof. The reflecting part may be formed at an edge of the lower surface of the lens part. The lens part and the wall part may be molded integrally with each other by a light-transmitting resin. The wall part may be formed so as to have a lens part coupling hole, and the lens part may be coupled to the lens part coupling hole in a state in which the lens part is formed separately from the wall part.

The wall part may include air circulation holes formed at positions facing each other.

The light emitting device may further include a phosphor layer formed by conformal coating in the light emitting diode chip.

The light emitting diode chip may be a frameless light emitting diode chip.

According to another exemplary embodiment of the present invention, there is provided an electronic apparatus including a light emitting device for a flash, the light emitting device including: a board; a light emitting diode chip mounted on the board; a molding part encapsulating the light emitting diode chip; and a lens cap coupled onto the board to cover the molding part, wherein an air gap is formed between the lens cap and the molding part.

The electronic apparatus may be a portable terminal including a digital camera or an imaging element.

The light emitting device may further include a phosphor layer formed by conformal coating in the light emitting diode chip.

An upper surface of the lens cap may be flat.

The lens cap may include a wall part and a lens part having a lens shape part.

The wall part may include one or more air circulation holes.

The light emitting diode chip may be a frameless light emitting diode chip.

According to the exemplary embodiments of the present invention, the light emitting diode chip in the lens cap is encapsulated by the molding part, particularly, the molding part having the dome shape, thereby making it possible to further improve light extracting efficiency. Further, in the light emitting device including the lens cap configured so as to cover the light emitting diode chip, an internal space of the lens cap is in communication with the outside of the lens cap by the air circulation holes formed in the lens cap, such that even though the vapor is captured in the lens cap, the vapor may be smoothly discharged to the outside. Therefore, a decrease in reliability caused by a stay of the vapor in the lens cap may be prevented.

DETAILED DESCRIPTION OF THE ILLUSTRATED EMBODIMENTS

Hereinafter, exemplary embodiments of the present invention will be described in detail with reference to the accompanying drawings. Exemplary embodiments to be provided below are provided by way of example so that the spirit of the present invention may be sufficiently transferred to those skilled in the art. Therefore, the present invention is not limited to exemplary embodiments to be described below, but may be implemented in other forms. In addition, in the accompanying drawings, widths, lengths, thicknesses, and the like, of components may be exaggerated for convenience.

In addition, a term "frameless light emitting diode (LED) chip" used in the present specification is used to distinguish it from a light emitting diode chip according to the related art and is a package that does not include a body forming an appearance of a light emitting diode chip, a reflector (that may be formed integrally with the body), and a lead frame, means a package of which an appearance is formed by the light emitting diode chip itself except for a lens part. A package of the frameless light emitting diode chip is called a wafer level package in terms of that most of the package is configured before the light emitting diode chip is diced on a wafer, is called a chip scale package in terms of that an appearance of the package is the same as or similar to that of the light emitting diode chip, or is also called a chip on board (COB) type light emitting diode package in terms of that the light emitting diode chip is mounted on a board without using an additional component such as a lead frame or a sub-mount. The "frameless light emitting diode chip" in the present invention is a chip configured of a light emitting diode package that does not include an appearance of the light emitting diode package, a reflector, and a body. An example of the frameless light emitting diode chip may include a light emitting diode disclosed in Korean Patent Laid-Open Publication No. 10-2011-0139385.

Since the frameless light emitting diode chip does not include an additional component and most of the processes of the frameless light emitting diode chip are completed by a semiconductor producing process, a time and a cost required for manufacturing the frameless light emitting diode chip may be decreased, and reliability of the frameless light emitting diode chip may be improved. In addition, since the frameless light emitting diode chip does not include a component forming the appearance of the package, the package may be miniaturized, such that it is appropriate for the frameless light emitting diode chip to be used for a slim information technology (IT) product demanding thinness of a component, and since the light emitting diode chip is mounted adjacently to the board, heat discharging efficiency is improved.

Figure 1:
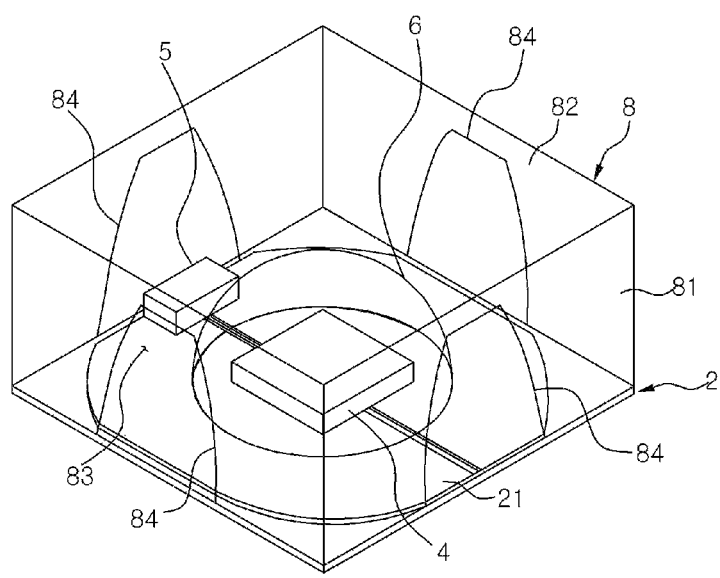
FIG. 1 is a perspective view illustrating a light emitting device according to a first exemplary embodiment of the present invention.
Figure 2:
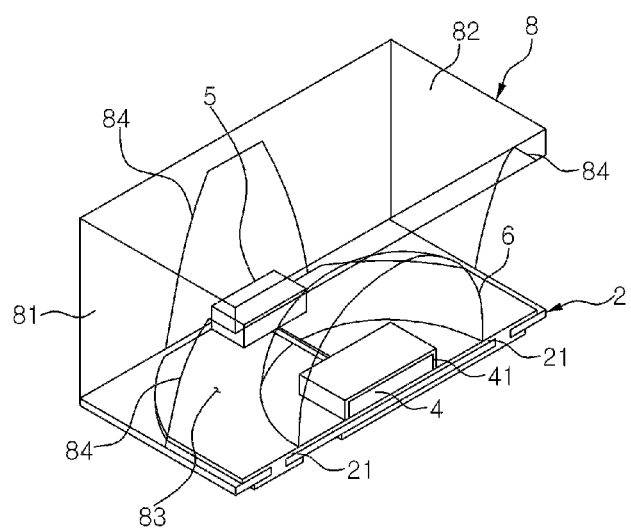
FIG. 2 is a cross-sectional perspective view illustrating the light emitting device according to the first exemplary embodiment of the present invention.
Figure 3:
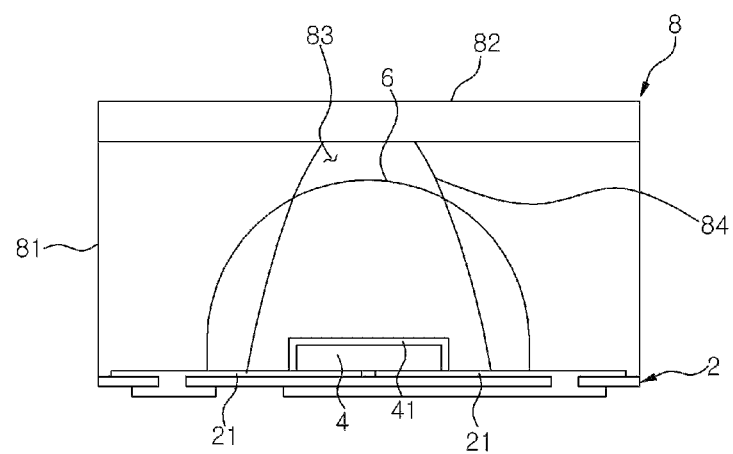
FIG. 3 is a cross-sectional view illustrating the light emitting device according to the first exemplary embodiment of the present invention.

FIG. 1 is a perspective view illustrating a light emitting device according to a first exemplary embodiment of the present invention, FIG. 2 is a cross-sectional perspective view illustrating the light emitting device according to the first exemplary embodiment of the present invention, and FIG. 3 is a cross-sectional view illustrating the light emitting device according to the first exemplary embodiment of the present invention.

As illustrated in FIGS. 1 to 3, the light emitting device according to the first exemplary embodiment of the present invention is configured to include a board 2, a light emitting diode chip 4, a molding part 6, and a lens cap 8.

The board 2 may be a board of a printed circuit board (PCB) structure in which it includes electrodes 21 and 21 spaced apart from each other on an upper surface thereof. Each of the electrodes 21 and 21 on the upper surface of the board 2 may penetrate through the board 2 or pass through an edge of the board 2 and be then extended to a lower surface of the board 2, as illustrated. Although not shown, a heat sink having a plate shape and made of a metal may be further formed on the lower surface of the board 2.

The light emitting diode chip 4 is mounted on the upper surface of the board 2, and is electrically connected to the electrodes 21 and 21 by, for example, flip chip bonding. In addition, the light emitting diode chip 4 includes a phosphor layer 41 formed by conformal coating. Light generated by the light emitting diode chip 4 and light of which a wavelength is converted by the phosphor layer 41 may be mixed with each other to generate light having an intended color, preferably, white light. Preferably, the light emitting diode chip 4 may be a frameless light emitting diode chip that does not include a separate frame, a sub-mount, a body, or the like. According to this exemplary embodiment, a height of the light emitting diode chip 4 becomes low, such that an entire height of the light emitting device becomes low, thereby making it possible to slim an electronic apparatus including the light emitting device.

The molding part 6 is formed on the board 2 so as to cover the light emitting diode chip 4. In the present exemplary embodiment, the molding part 6 has a dome lens shape, and is formed in the dome lens shape by compression molding or transfer molding using a resin such as silicon, epoxy, or the like, or a resin composite including this resin. It is preferable that an air gap is not present between the molding part 6 and the light emitting diode chip 4, and light extracting efficiency from the light emitting diode chip 4 may be improved by the molding part 6 that does not include the air gap. In addition, the molding part 6 may be used in order to adjust a viewing angle of light.

The lens cap 8 is coupled onto the board 2 by a surface mounting technology (SMT) so as to cover the molding part 6 and the light emitting diode chip 4 encapsulated in the molding part 6. The lens cap 8 includes a wall part 81 bonded to the board 2 while enclosing the surrounding of the molding part 6 and the light emitting diode chip 4 disposed in the molding part 6 and a flat panel type lens part 82 positioned above the molding part 6 and the light emitting diode chip 4 disposed in the molding part 6.

In the present exemplary embodiment, it is preferable that the lens cap 8 is made of a resin material such as epoxy, silicon, or the like, that may be mounted by the SMT and generates less problems or does not have a problem in an appearance such as a twist, or the like, at the time of the SMT. Particularly, the wall part 81 is bonded to regions in which the electrodes 21 are not present on the board 2, such that bonding force may be enhanced.

In addition, the lens cap 8 is formed by molding a light-transmitting resin material. That is, the lens cap 8 in which the wall part 81 and the lens part 82 are molded integrally with each other is formed by a resin molding process using a mold limiting shapes of the wall part 81 and the lens part 82.

In addition, although the lens part 82 may have various kinds of lens shape parts, it is preferable that the lens part 82 has a flat panel type lens structure in which both of an upper surface and a lower surface are flat. In addition, the lens cap 8 may include a diffusion material therein for the purpose of improvement of color uniformity of emitted light and an appearance. The diffusion material may be uniformly distributed in the lens cap 8 or be concentrated on the lens part 82.

In addition, an air gap 83 is formed at an inner side of the lens cap 8, more specifically, between the lens cap 8 and the molding part 6. Here, a plurality of air circulation holes 84 are formed in the wall part 81 of the lens cap 8 in order to make a flow of air between a space in the lens cap 8, that is, the air gap 83 and the outside of the lens cap 8 smooth.

The air circulation holes 84 allow moisture in the air gap 83, particularly, vapor created by heat generated at the time of an operation of the light emitting diode chip to be smoothly discharged to the outside of the lens cap 8, thereby improving reliability of the light emitting device.

The lens cap 8 has an approximately rectangular parallelepiped shape or a regular hexahedral shape in which the wall part 81 is configured of sidewalls of four rectangles or squares, and the air circulation holes 84 are formed in the side walls, that is, a front side wall, a rear side wall, a left side wall, and a right side wall, respectively. According to the exemplary embodiment, another air circulation hole 84 is positioned so as to face one air circulation hole 84, thereby making it possible to circulate the air inside and outside the lens cap 8 better. In the present exemplary embodiment, each of the air circulation holes 84 is extended to a position at which it contacts the board 2, such that it has an opened shape. However, it is to be noted that the air circulation hole 84 may be finished before a position at which it contacts the board to have a closed shape.

Additionally, the light emitting device may include a Zener diode 5. The Zener diode 5 is mounted on the board 2, and is positioned outside the molding part 6 and inside the lens cap 8 so as not to hinder the light from the light emitting diode chip 4.

Figure 4:
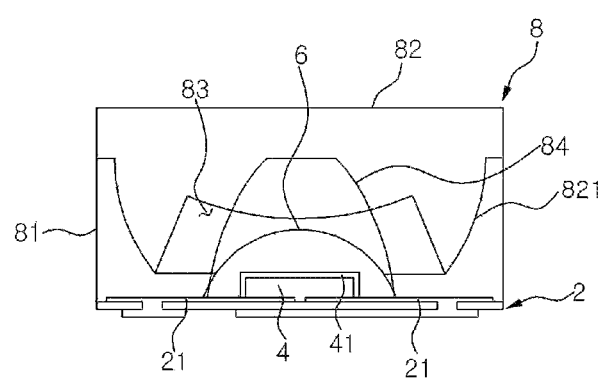
FIG. 4 is a cross-sectional view illustrating a light emitting device according to a second exemplary embodiment of the present invention.
Figure 5:
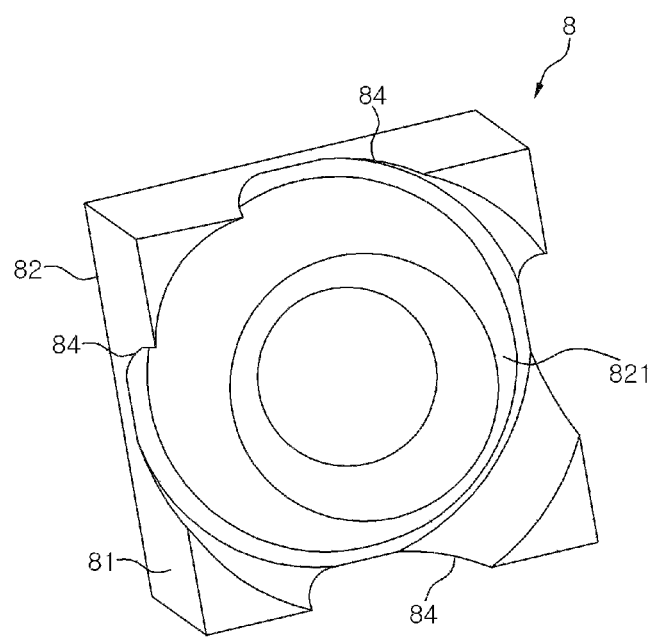
FIG. 5 is a bottom perspective view illustrating a lens cap of the light emitting device illustrated in FIG. 4.

FIG. 4 is a cross-sectional view illustrating a light emitting device according to a second exemplary embodiment of the present invention, and FIG. 5 is a bottom perspective view illustrating a lens cap of the light emitting device illustrated in FIG. 4.

Referring to FIGS. 4 and 5, the light emitting device according to a second exemplary embodiment of the present invention is configured to include a board 2, a light emitting diode chip 4 mounted on the board 2, a molding part 6 covering the light emitting diode chip 4, and a lens cap 8 coupled onto the board 2 so as to cover the molding part 6, similar to the first exemplary embodiment described above. The board 2, the light emitting diode chip 4, and the molding part 6 have configurations that are the same as or similar to those of the first exemplary embodiment described above. Therefore, a description for the board 2, the light emitting diode chip 4, and the molding part 6 will be omitted in order to avoid an overlapped description.

The lens cap 8 is made of a light-transmitting resin such as epoxy, silicon, or the like, and includes a wall part 81 in which air circulation holes 84 are formed and a lens part 82 formed integrally with the wall part 81. A process of molding the lens cap 8 so as to have the wall part 81 and the lens part 82 formed integrally with each other is the same as that of the first exemplary embodiment described above.

Figure 6:
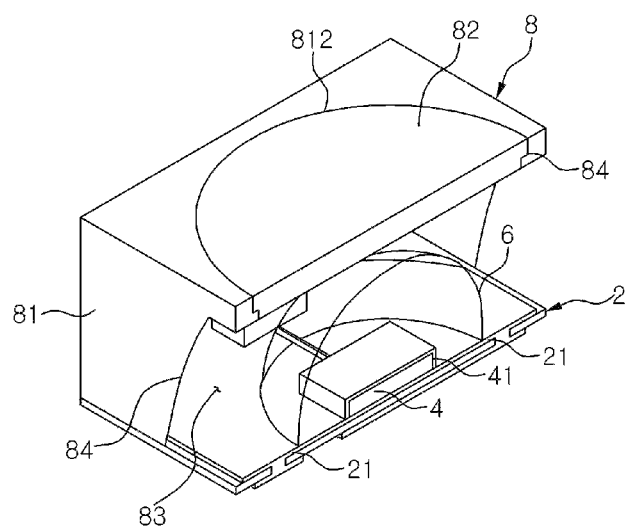
FIG. 6 is a cross-sectional perspective view illustrating a light emitting device according to a third exemplary embodiment of the present invention.

According to the second exemplary embodiment of the present invention, the lens part 82 includes a lower surface having a TIR lens shape 821 widely spreading light from the center toward an outer side by internal total reflection and a flat upper surface. As illustrated well in FIG. 5, the TIR lens shape 821 includes a refracting part and a reflecting part and may have a conical shape having a concave groove formed at the center thereof. The reflecting part is formed at an edge of the lens part 82. FIG. 6 is a cross-sectional perspective view illustrating a light emitting device according to a third exemplary embodiment of the present invention. Referring to FIG. 6, the light emitting device according to the third exemplary embodiment of the present invention is configured to include a board 2, a light emitting diode chip 4 mounted on the board 2, a molding part 6 encapsulating the light emitting diode chip 4, and a lens cap 8 coupled onto the board 2 so as to cover the molding part 4 and the light emitting diode chip 4 encapsulated in the molding part 4. Here, the lens cap 8 includes a wall part 81 and a lens part 82. However, unlike the first and second exemplary embodiments described above, the wall part 81 and the lens part 82 are separately molded and are then coupled to each other to configure the lens cap 8. In detail, a lens part coupling hole 812 having a step is formed at an upper end of the wall part 81 and the flat panel type lens part 82 is coupled to the lens part coupling hole 812 to form the lens cap 8. The lens part 82 may be a flat panel type lens in which both of an upper portion and a lower portion thereof are flat. Similar to the exemplary embodiments described above, air circulation holes 84 for smoothly discharging moisture or vapor are formed in the wall part 81. The wall part 81 may have a color such as a white color, an ivory white color, or the like, having good reflection characteristics on at least an inner surface thereof so that the inner surface thereof may be used as a reflection surface, and the internal surface may be formed as an inclined surface. It is to be noted that a TIR lens part including a lens shape part having a refracting part and a reflecting part formed on a lower surface thereof, instead of the flat panel type lens part, may be used as the lens part 82 coupled to the lens part coupling hole 812 of the wall part 81. The light emitting device described above may be preferably used for a flash in, for example, a digital camera, a camera phone, or the like.

The invention claimed is:

1. A light emitting device, comprising:
   a board;
   a light emitting diode chip disposed on the board;
   a molding part disposed on the board and covering the light emitting diode chip; and a lens cap disposed on the board and covering the molding part and comprising:
  a wall part bonded to the board and enclosing the light emitting diode chip, the wall part having an exterior first side and an exterior second side facing the exterior first side; and
  a lens part disposed above the light emitting diode chip,
wherein an air gap is disposed between the lens cap and the molding part,
wherein the exterior first side of the wall part comprises a first air circulation hole exposing the molding part, and
wherein the exterior second side of the wall part comprises a second air circulation hole exposing the molding part.

2. The light emitting device of claim 1, wherein the molding part comprises a dome shape.

3. The light emitting device of claim 1, wherein an upper surface of the lens part is flat.

4. The light emitting device of claim 1, wherein the lens part comprises a refracting part and a reflecting part disposed on a lower surface of the lens part.

5. The light emitting device of claim 4, wherein the reflecting part is disposed at an edge of the lower surface of the lens part.

6. The light emitting device of claim 1, wherein the lens part and the wall part are molded integrally with each other by a light-transmitting resin.

7. The light emitting device of claim 1, wherein the wall part is formed separately from the lens part, and the formed wall part comprises a lens part coupling hole connected to the lens part.

8. The light emitting device of claim 1, further comprising a phosphor layer formed by conformal coating on the light emitting diode chip.

9. The light emitting device of claim 1, wherein the light emitting diode chip is a frameless light emitting diode chip.

10. An electronic apparatus, comprising;
  a light emitting device configured to produce a flash, the light emitting device comprising:
    a board;
    a light emitting diode chip disposed on the board;
    a molding part encapsulating the light emitting diode chip; and
    a lens cap disposed on the board and covering the molding part and comprising:
    a wall part bonded to the board and enclosing the light emitting diode chip, the wall part having an exterior first side and an exterior second side facing the exterior first side; and
    a lens part disposed above the light emitting diode chip,
  wherein an air gap is disposed between the lens cap and the molding part,
  wherein the exterior first side of the wall part comprises a first air circulation hole exposing the molding part, and
  wherein the exterior second side of the wall part comprises a second air circulation hole exposing the molding part.

11. The electronic apparatus of claim 10, wherein the electronic apparatus is a portable terminal comprising at least one of a digital camera and an imaging element.

12. The electronic apparatus of claim 10, wherein the light emitting device further comprises a phosphor layer disposed by conformal coating on the light emitting diode chip.

13. The electronic apparatus of claim 10, wherein an upper surface of the lens cap is flat.

14. The electronic apparatus of claim 10, wherein the light emitting diode chip is a frameless light emitting diode chip.

15. The light emitting device of claim 1, wherein the light emitting device is configured to circulate air between the lens cap and the molding part by receiving external air via the first air circulation hole and ejecting internal air via the second air circulation hole.

16. The light emitting device of claim 1, wherein: the wall part further comprises:
  an exterior third side of the wall part comprising a third air circulation hole exposing the molding part, and
  an exterior fourth side of the wall part facing the exterior third side and comprising a fourth air circulation hole exposing the molding part, and
  the light emitting device is configured to circulate air between the lens cap and the molding part by receiving external air via the first air circulation hole and ejecting internal air via at least one of the second, third, and fourth air circulation holes.

17. The electronic apparatus of claim 10, wherein the light emitting device is configured to circulate air between the lens cap and the molding part by receiving external air via the first air circulation hole and ejecting internal air via the second air circulation hole.

18. The electronic apparatus of claim 10, wherein: the wall part further comprises:
  an exterior third side of the wall part comprising a third air circulation hole exposing the molding part, and
  an exterior fourth side of the wall part facing the exterior third side and comprising a fourth air circulation hole exposing the molding part, and
  the light emitting device is configured to circulate air between lens cap and the molding part by receiving external air via the first air circulation hole and ejecting internal air via at least one of the second, third, and fourth air circulation holes.

* * * * *